United States Patent
Bu

(10) Patent No.: US 9,748,284 B2
(45) Date of Patent: Aug. 29, 2017

(54) THIN FILM TRANSISTOR, METHOD FOR FABRICATING THE SAME, AND ARRAY SUBSTRATE

(71) Applicant: BOE TECHNOLOGY GROUP CO., LTD., Beijing (CN)

(72) Inventor: Qianqian Bu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/099,185

(22) Filed: Apr. 14, 2016

(65) Prior Publication Data

US 2016/0358952 A1    Dec. 8, 2016

(30) Foreign Application Priority Data

Jun. 8, 2015 (CN) .......................... 2015 1 0307486

(51) Int. Cl.
| | | |
|---|---|---|
| *H01L 29/78* | (2006.01) | |
| *H01L 27/12* | (2006.01) | |
| *H01L 29/786* | (2006.01) | |
| *H01L 29/66* | (2006.01) | |
| *H01L 21/02* | (2006.01) | |

(52) U.S. Cl.
CPC .... *H01L 27/1281* (2013.01); *H01L 21/02532* (2013.01); *H01L 21/02675* (2013.01); *H01L 27/1222* (2013.01); *H01L 29/66757* (2013.01); *H01L 29/78675* (2013.01)

(58) Field of Classification Search
None
See application file for complete search history.

(56) References Cited

U.S. PATENT DOCUMENTS

| | | | |
|---|---|---|---|
| 2005/0142708 A1* | 6/2005 | Son | H01L 21/2026 438/166 |
| 2005/0199876 A1* | 9/2005 | Matsumoto | H01L 27/323 257/64 |
| 2008/0087889 A1* | 4/2008 | Chan | H01L 27/1229 257/40 |
| 2011/0318891 A1* | 12/2011 | Oda | H01L 29/42384 438/166 |
| 2014/0299845 A1* | 10/2014 | Kim | H01L 51/56 257/40 |

* cited by examiner

*Primary Examiner* — Sitaramarao S Yechuri
(74) *Attorney, Agent, or Firm* — Nath, Goldberg & Meyer; Joshua B. Goldberg; Stanley N. Protigal

(57) ABSTRACT

Embodiments of the present invention provide a thin film transistor, a method for fabricating the same and an array substrate. The thin film transistor comprises a base substrate and an active region and a plurality of reflective plates formed on the base substrate, wherein the plurality of reflective plates are spaced apart from each other and provided at least at positions corresponding to the active region, the active region comprises polysilicon, and the polysilicon in the active region is formed by irradiating an amorphous silicon layer with laser emitted from a side of the amorphous silicon layer away from the reflective plates.

19 Claims, 2 Drawing Sheets

THIN FILM TRANSISTOR, METHOD FOR FABRICATING THE SAME, AND ARRAY SUBSTRATE

CROSS-REFERENCE TO RELATED APPLICATION

This application claims priority to Chinese Patent Application No. 201510307486.8, filed on Jun. 8, 2015, the contents of which are incorporated by reference in the entirety.

FIELD OF THE INVENTION

The present invention relates to the field of polysilicon thin film transistor fabrication technology, and particularly, relates to a thin film transistor, a method for fabricating the same, and an array substrate.

BACKGROUND OF THE INVENTION

In a polysilicon thin film transistor, polysilicon material is used to form an active region. The polysilicon in the active region may be formed from an amorphous silicon layer, and specifically, an amorphous silicon layer may be first formed and then be irradiated with laser to be melted, the melted silicon turns into polysilicon after being solidified again, and such a process is referred to as "laser annealing" .

Grain size, growth direction, distribution and the like of the polysilicon in the active region have an important influence on performance of a thin film transistor, and these parameters are all related to temperature distribution (temperature gradient) in the laser annealing. However, in an existing laser annealing process, annealing temperature can be controlled simply by adjusting laser power only, it is very difficult to form a certain temperature gradient, and thus, performance of the obtained polysilicon active region cannot be controlled.

SUMMARY OF THE INVENTION

In order to solve at least the problem that it is difficult to control performance of the active region in an existing polysilicon thin film transistor, embodiments of the present invention provide a thin film transistor in which polysilicon active region has good performance, a method for fabricating the same, and an array substrate.

Embodiments of the present invention provide a thin film transistor comprising a base substrate and an active region and a plurality of reflective plates formed on the base substrate, wherein the plurality of reflective plates are spaced apart from each other and provided at least at positions corresponding to the active region, the active region comprises polysilicon, and the polysilicon in the active region is formed by irradiating an amorphous silicon layer with laser emitted from a side of the amorphous silicon layer away from the reflective plates.

The reflective plate may have a rectangular shape, a length of the reflective plate may range from 30 nm to 50 nm, and a width of the reflective plate may range from 10 nm to 30 nm.

A distance between adjacent reflective plates may range from 30 nm to 70 nm.

A thickness of the reflective plate may range from 50 nm to 80 nm.

The active region may be positioned at a side of the reflective plate away from the base substrate.

The thin film transistor may further comprise a gate insulation layer, a gate, a source and a drain. The gate insulation layer, the gate, the source and the drain may be provided at a side of the active region away from the reflective plates.

The reflective plate may be made of a metal material.

The thin film transistor may further comprise an insulation layer provided between the active region and the reflective plates.

The metal material may comprise neodymium and/or aluminum

The thin film transistor may further comprise a filling layer provided in gaps between the reflective plates, and the filling layer has the same thickness as the reflective plates.

The reflective plates may be provided at only the positions corresponding to the active region.

Alternatively, the reflective plates may be provided throughout the entire base substrate.

Embodiments of the present invention further provide an array substrate comprising the above thin film transistor.

Embodiments of the present invention further provide a method for fabricating the above thin film transistor, comprising steps of: forming the reflective plates and the amorphous silicon layer on the base substrate; and irradiating the amorphous silicon layer with laser such that the amorphous silicon layer is crystallized into a polysilicon layer, wherein the laser is emitted from the side of the amorphous silicon layer away from the reflective plates.

In the method, the laser irradiating onto the reflective plates is reflected back by the reflective plates and irradiates on the amorphous silicon layer again, so that a temperature of parts of the amorphous silicon layer at positions corresponding to the reflective plates is further increased to form a temperature gradient.

In the method, the reflective plate may be made of a metal material.

In the method, the step of forming the reflective plates and the amorphous silicon layer on the base substrate may comprise: forming the plurality of reflective plates spaced apart from each other on the base substrate; forming a filling layer in gaps between the plurality of reflective plates; forming an insulation layer on the plurality of reflective plates and the filling layer; and forming the amorphous silicon layer on the insulation layer.

The method may further comprise: performing a patterning process on the polysilicon layer to form a pattern of the active region.

Alternatively, the method may further comprise: performing, after forming the amorphous silicon layer, a patterning process on the amorphous silicon layer to form a pattern corresponding to the active region.

The method may further comprise: forming patterns comprising a gate insulation layer, a gate, a source and a drain after laser irradiation.

The thin film transistor according to the embodiments of the present invention comprises the reflective plates, and the polysilicon material of the active region thereof is obtained by performing a laser annealing on the amorphous silicon layer. In the laser annealing, since the amorphous silicon layer is very thin, laser can pass through the amorphous silicon layer, be reflected back by the reflective plates and irradiate on the amorphous silicon layer again. In this way, parts of the amorphous silicon layer at positions corresponding to the reflective plates are irradiated by laser twice and thus have a higher temperature, whereas the remaining parts of the amorphous silicon layer corresponding to the positions not provided with the reflective plates are irradiated by the laser only once and thus have a lower temperature, therefore, a controllable temperature gradient (controlled by adjusting the reflective plates) is formed in the amorphous silicon layer by means of the reflective plates, and the grain size, the growth direction, the distribution and the like of the polysilicon formed in the laser annealing are thus controllable, thereby improving performance of the thin film transistor.

DETAILED DESCRIPTION OF THE EMBODIMENTS

To provide a better understanding of the technical solutions of the present invention for those skilled in the art, the present invention will be described in detail below in conjunction with the accompanying drawings and specific implementations.

Figure 1:
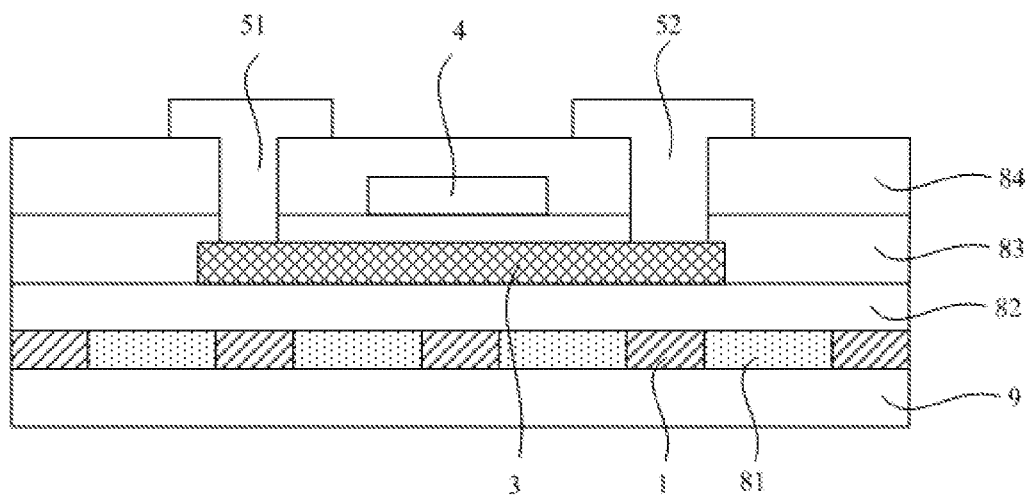
FIG. 1 is a cross-sectional structural diagram of a thin film transistor according to an embodiment of the present invention.

Embodiments of the present invention provide a thin film transistor. As shown in FIG. 1, the thin film transistor comprises a base substrate 9, an active region 3 formed by polysilicon, and a plurality of reflective plates 1 which are spaced apart from each other and provided at least at positions corresponding to the active region 3.

In the thin film transistor, the polysilicon in the active region 3 is formed by irradiating an amorphous silicon layer with laser, and the laser is emitted from a side of the amorphous silicon layer away from the reflective plates 1.

That is to say, the thin film transistor according to the embodiments of the present invention comprises the active region 3 formed by polysilicon and provided on the base substrate 9, and also comprises the plurality of reflective plates 1 spaced apart from each other and capable of reflecting light, the reflective plates 1 are distributed at least at the positions corresponding to the active region 3. That is, the plurality of reflective plates 1 are provided at the positions corresponding to the active region 3.

Figure 4:
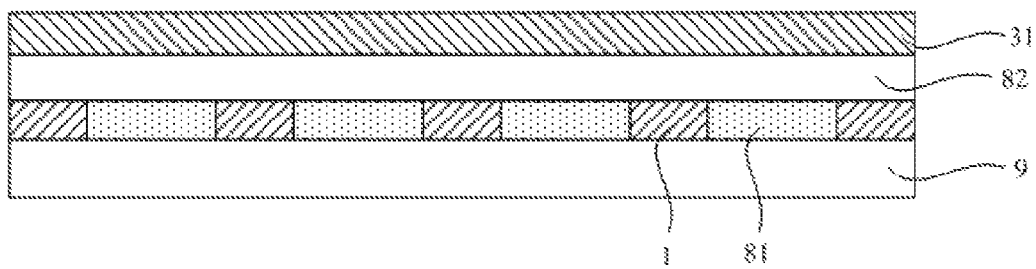
FIG. 4 is a cross-sectional structural diagram of the thin film transistor after forming an amorphous silicon layer according to the embodiment of the present invention.
Figure 5:
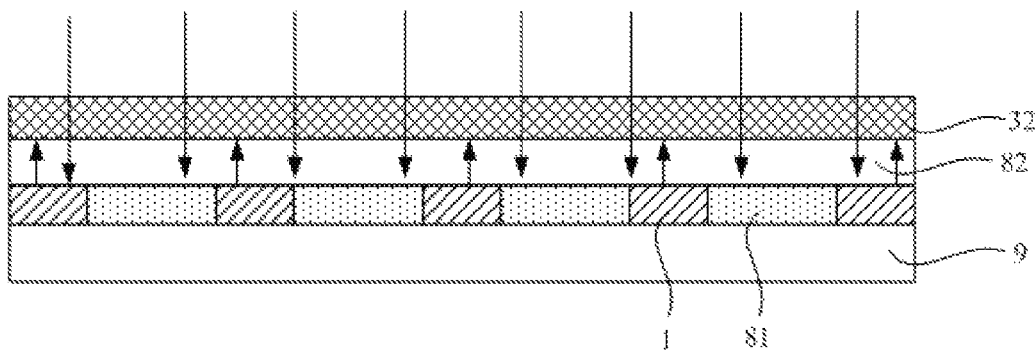
FIG. 5 is a cross-sectional structural diagram of the thin film transistor during a laser annealing according to the embodiment of the present invention.

The polysilicon material of the active region 3 is obtained by performing a laser annealing on an amorphous silicon layer. Referring to FIGS. 4 and 5, in the laser annealing process, since the amorphous silicon layer 31 is very thin, laser can pass through the amorphous silicon layer 31 and be reflected back by the reflective plates 1 to irradiate onto the amorphous silicon layer 31 again. In this way, parts of the amorphous silicon layer 31 at the positions corresponding to the reflective plates 1 are irradiated by the laser twice and thus have a higher temperature, whereas the remaining parts of the amorphous silicon layer 31 (that is, the parts not corresponding to the reflective plates 1) are irradiated by the laser only once and thus have a lower temperature. As a result, a controllable temperature gradient is formed between the parts of the amorphous silicon layer 31 corresponding to the reflective plates 1 and the remaining parts of the amorphous silicon layer 31, and the grain size, the growth direction, the distribution and the like of the formed polysilicon are thus controllable, which may improve the performance of the thin film transistor. For example, the temperature gradient may be controlled by adjusting sizes, shapes and positions of the reflective plates 1.

In some embodiments, each reflective plate 1 may have a rectangular shape. The length of the reflective plate 1 may be in the range of 30 nm to 50 nm, and the width of the reflective plate 1 may be in the range of 10 nm to 30 nm. In addition, the distance between adjacent reflective plates 1 may be in the range of 30 nm to 70 nm.

When such reflective plates 1 are adopted, each reflective plate 1 substantially corresponds to one crystalline grain, that is, the high-temperature area formed by each reflective plate 1 corresponds to the core of the crystalline grain, and the surrounding low-temperature area thereof facilitates growth of the crystalline grain in a predetermined direction (i.e., temperature gradient direction), so that the most qualified crystalline grain can be obtained.

In some embodiments, the thickness of the reflective plate 1 may be in the range of 50 nm to 80 nm.

It could be understood that, the reflective plate 1 cannot achieve a good reflecting effect if it is too thin, and may impact other structure(s) if it is too thick, and the thickness thereof in the range of 50 nm to 80 nm is preferable.

In some embodiments, the active region 3 is positioned at one side of the reflective plate 1 away from the base substrate 9.

That is to say, as shown in FIG. 1, the reflective plate 1 is provided below the active region 3, that is, during the fabricating process, the reflective plate 1 is first formed, and then the active region 3 is formed. In a common laser annealing process, laser is emitted from one side of the amorphous silicon layer 31 away from the base substrate 9. In the process of fabricating the thin film transistor according to the embodiments of the present invention, the configuration of the reflective plates 1 may allow laser to be emitted from one side of the active region 3 (the amorphous silicon layer 31) away from the reflective plates 1. Therefore, the above structure of the thin film transistor according to the embodiments of the present invention may be combined with the existing laser techniques.

In some embodiments, the thin film transistor may further comprise a gate insulation layer 83, a gate 4, a source 51, and a drain 52. The gate insulation layer 83, the gate 4, the source 51 and the drain 52 are all provided at the side of the active region 3 away from the reflective plates 1.

The thin film transistor comprises other structures such as the gate insulation layer 83, the gate 4, the source 51, the drain 52, etc., and the presence of the reflective plates 1 inevitably has a certain impact on connections, inductions and the like between these structures and the active region 3. Therefore, preferably, the reflective plates 1 are positioned at one side of the active region 3, while the other structures are all positioned at the other side of the active region 3.

When the reflective plates 1 are provided below the active region 3, that is, when the active region 3 is positioned at one side of the reflective plate 1 away from the base substrate 9, the other structures are all positioned at the side of the active region 3 away from the reflective plates 1. That is to say, as shown in FIG. 1, the gate insulation layer 83, the gate 4, the source 51, the drain 52 and the like are all positioned above the active region 3, and the thin film transistor is of a top-gate type.

A laser annealing is performed after the reflective plates 1 and the amorphous silicon layer 31 have been formed. During the laser annealing, absence of the other structures (e.g., the gate 4, the source 51, the drain 52, etc.) will facilitate performing the laser annealing, because these structures will impact transfer of laser. According to the structure of the thin film transistor of the embodiments of the present invention, other structures are not formed after forming the reflective plates 1 and the amorphous silicon layer 31 and before performing the laser annealing, which facilitates performing the laser annealing.

In some embodiments, the reflective plate 1 is made of metal material, and the metal material comprises, for example, neodymium and/or aluminum In addition, an insulation layer 82 is formed between the active region 3 and the reflective plates 1.

That is to say, the reflective plate 1 may be made of metal, because the metal is the most commonly-used reflective material, and has a mature production process and a low cost. Specifically, the metal material may be neodymium, aluminum, neodymium-aluminum alloy, or the like, which has high reflectivity. In addition, since the metal is electrically conductive, if the reflective plates 1 made of metal come into contact with the active region 3, performance of the active region 3 is impacted, and therefore, the insulation layer 82 made of insulation material (e.g., silicon oxide, silicon nitride, etc.) needs to be provided between the reflective plates 1 and the active region 3.

In other embodiments, an insulating and reflective material may be adopted to form the reflective plates 1, and in this case, the reflective plates 1 and the active region 3 may be in direct contact without the insulation layer 82 provided therebetween.

In some embodiments, the thin film transistor may further comprise a filling layer 81 provided in gaps between the plurality of reflective plates 1, and the filling layer 81 has the same thickness as the reflective plates 1.

Since the plurality of reflective plates 1 are spaced apart from each other, upper surfaces of the reflective plates 1 and the gaps therebetween together form a concave-convex structure, which may influence the structure(s) formed thereon. In the embodiments of the present invention, as shown in FIG. 1, the filling layer 81 which has the same thickness as the reflective plates 1 may be formed in the gaps between the reflective plates 1, and the upper surface of the filling layer 81 is substantially coplanar with those of the reflective plates 1, that is, the upper surfaces of the filling layer 81 and the reflective plates 1 together form a flat surface, which is favorable for forming other structure(s).

In some embodiments, the filling layer 81 may be not provided, and instead, a layer having a large thickness may be provided on the reflective plates 1 to eliminate the concave-convex structure and provide a flat surface.

In some embodiments, the reflective plates 1 may be arranged at only the positions corresponding to the active region 3.

That is to say, the reflecting plates 1 may be only provided in regions corresponding to the active region 3, so as to prevent the reflective plates 1 from adversely affecting structures at other positions.

In other embodiments, the reflective plates 1 are provided throughout the entire base substrate 9.

That is to say, the reflective plates 1 may be arranged throughout the entire base substrate 9 and the gaps are formed between the reflective plates 1. The thin film transistor is generally employed in an array substrate or the like, and one array substrate often comprises many thin film transistors (active regions 3) located at specific positions. If the reflective plates 1 are arranged at only the positions corresponding to the active region 3, accuracy requirement for positions at which the reflective plates 1 are formed is very high.

Embodiments of the present invention further provide an array substrate, which comprises the above thin film transistor.

The array substrate according to the embodiments of the present invention may be an array substrate used in a liquid crystal display, an organic light emitting diode display, or the like, and comprises a large number of thin film transistors arranged in an array, and at least one of these thin film transistors is the above-described thin film transistor.

The array substrate may further comprise lead wires (e.g., gate lines, data lines, common electrode lines, etc.), pixel electrodes, common electrodes, organic light-emitting diodes, pixel define layers and other known structures, which are not described in detail herein.

Embodiments of the present invention further provide a method for fabricating the above thin film transistor, comprising steps of: forming reflective plates 1 and an amorphous silicon layer 31 on a base substrate 9; and irradiating the amorphous silicon layer 31 with laser, which is emitted from one side of the amorphous silicon layer 31 away from the reflective plates 1, to crystallize the amorphous silicon layer 31.

That is to say, in the process of fabricating the above thin film transistor, the reflective plates 1 and the amorphous silicon layer 31 are formed first, and then the laser is emitted from the side of the amorphous silicon layer 31 away from the reflective plates 1 to perform a laser annealing to crystallize the amorphous silicon layer 31. In the method, the sequence of forming the amorphous silicon layer 31 and the reflective plates 1 may depend on the structure of the thin film transistor, as long as both are formed before the laser annealing.

The method may further comprise a step of forming a pattern of a polysilicon active region 3. Specifically, first, the amorphous silicon layer 31 is crystallized to obtain a polysilicon layer 32, and then a patterning process is performed on the polysilicon layer 32 to obtain the pattern of the active region 3. Alternatively, first, a patterning process is performed on the amorphous silicon layer 31 to form a pattern corresponding to the active region 3, and then the pattern of the amorphous silicon layer 31 is crystallized to form the pattern of the active region 3.

In the method, the patterning process refers to a process in which a part of a layer is removed such that the remaining part of the layer forms the desired structure, and specifically, may comprise one or more steps of forming a material layer, applying a photoresist, exposing, developing, etching, stripping off the photoresist, and the like.

In addition, the method further comprises steps of forming other structures such as a gate insulation layer 83, a gate 4, a source 51, a drain 52, and the like, and these steps may be determined according to the structure of the thin film transistor.

Specifically, the method for fabricating a thin film transistor according to the embodiments of the present invention comprises the following steps S101 to S107.

Step S101 comprises: forming a pattern comprising reflective plates 1 on a base substrate 9 by a patterning process.

Figure 2:
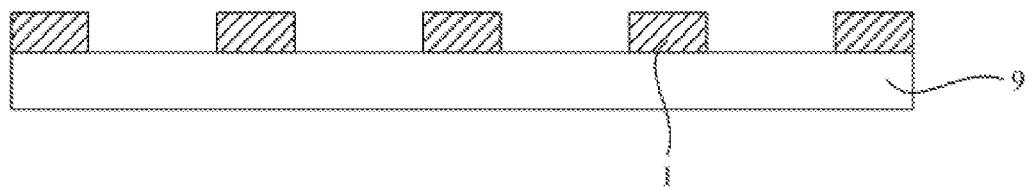
FIG. 2 is a cross-sectional structural diagram of a thin film transistor after forming reflective plates according to an embodiment of the present invention.

In this step, as shown in FIG. 2, a plurality of reflective plates 1 spaced apart from each other are formed on the base substrate 9 by a patterning process. The base substrate 9 may be made of glass, and the reflective plates 1 may be made of metal. The reflective plates 1 may have a size and a shape as described above.

Step S102 comprises: forming a pattern comprising a filling layer 81 on the base substrate 9 subjected to the above step by a patterning process.

Figure 3:
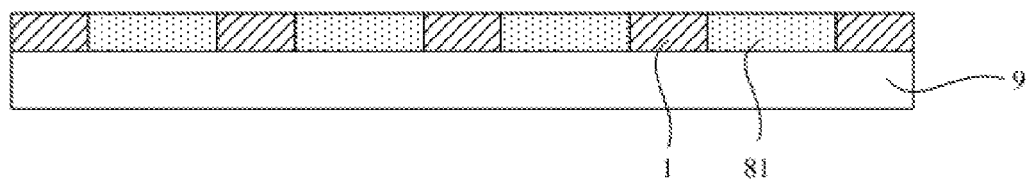
FIG. 3 is a cross-sectional structural diagram of the thin film transistor after forming a filling layer according to the embodiment of the present invention.

In this step, as shown in FIG. 3, the filling layer 81 is formed in gaps between the plurality of reflective plates 1 by a patterning process. The filling layer 81 may be made of silicon nitride (SiNx), as bonding strength between silicon nitride and glass is strong.

Step S103 comprises: forming an insulation layer 82 on the base substrate 9 subjected to the above steps.

In this step, the insulation layer 82 covering both of the reflective plates 1 and the filling layer 81 is formed, to separate the reflective plates 1 from the active region 3. The insulation layer 82 may be made of silicon oxide (SiOx), as bonding strength between silicon oxide and silicon is strong.

Step S104 comprises: forming an amorphous silicon layer 31 on the base substrate 9 subjected to the above steps.

In this step, as shown in FIG. 4, the amorphous silicon layer 31 covering the insulation layer 82 is formed. The amorphous silicon layer 31 may have a thickness in the range of 40 nm to 50 nm.

Step S105 comprises: performing a laser annealing such that the amorphous silicon layer 31 is crystallized to form a polysilicon layer 32, wherein laser is emitted from one side of the amorphous silicon layer 31 away from the reflective plates 1.

In this step, as shown in FIG. 5, the amorphous silicon layer 31 is irradiated with laser over the amorphous silicon layer 31. In the process of irradiation, the laser irradiating on the reflective plates 1 is reflected back by the reflective plates 1 and irradiates on the amorphous silicon layer 31 again, so that the temperature of parts of the amorphous silicon layer 31 at corresponding positions is further increased, resulting in the desired temperature gradient. Consequently, it is ensured that the grain size, the growth direction, the distribution and the like of the formed polysilicon layer 32 satisfy the requirements.

In this step, parameters in the laser annealing may be set as follows: laser wavelength: 308 nm; laser energy range: 200 mJ/cm$^2$ (millijoule per square centimeter) to 500 mEcm$^2$; and degree of overlap (i.e., the percentage of overlapping part of the regions covered by laser in two scanning processes): 96% to 99%.

Step S106 comprises: forming a pattern comprising an active region 3 by performing a patterning process on the polysilicon layer 32.

Figure 6:
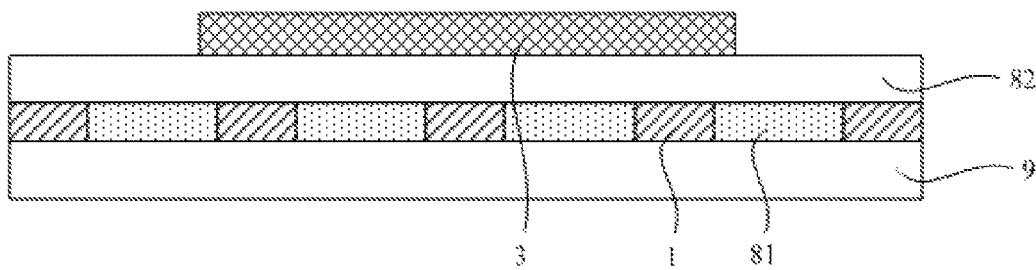
FIG. 6 is a cross-sectional structural diagram of the thin film transistor after forming an active region according to the embodiment of the present invention.

In this step, as shown in FIG. 6, the part of the polysilicon layer 32 other than the pattern of the active region 3 is removed so that the remaining part of the polysilicon layer 32 forms the active region 3.

It could be understood that, this step may be performed on the amorphous silicon layer 31 in step S104, that is, it is feasible that a patterning process is first performed on the amorphous silicon layer 31 in step S104 (to form a pattern corresponding to the active region 3), and then in the laser annealing in step S105, the pattern of the amorphous silicon layer 31 turns into the pattern of the active region 3 after being crystallized.

Step S107 comprises: forming patterns comprising a gate insulation layer 83, a gate 4, a passivation layer 84, a source 51 and a drain 52, thereby obtaining the thin film transistor.

In this step, other structures in the thin film transistor such as the gate insulation layer 83, the gate 4, the passivation layer 84, the source 51, the drain 52, etc., are subsequently formed by conventional processes, so as to complete the fabrication of the thin film transistor and obtain the thin film transistor as shown in FIG. 1. Since the methods for forming these structures are known and varied, they are not described in detail herein.

It could be understood that the foregoing implementations are merely exemplary implementations for describing the principle of the present invention, but the present invention is not limited thereto. A person of ordinary skill in the art may make various modifications and improvements without departing from the spirit and essence of the present invention, and these modifications and improvements shall fall within the protection scope of the present invention.

What is claimed is:

1. A top-gate thin film transistor (TFT), comprising a base substrate and an active region and a plurality of reflective plates formed on the base substrate, wherein:
   the plurality of reflective plates are spaced apart from each other and provided at least at positions corresponding to the active region,
   the active region comprises polysilicon, and the polysilicon in the active region is formed by irradiating an amorphous silicon layer with laser emitted from a side of the amorphous silicon layer away from the reflective plates; and
   the thin film transistor further comprises:
      a filling layer provided in gaps between the plurality of reflective plates, the surface of the filling layer and upper surfaces of the plurality of reflective plates substantially coplanar; and
      an insulation layer provided between the active region and the reflective plates so as to cover the reflective plates and the filling layer, and made of a material different from that of the filling layer.

2. The thin film transistor of claim 1, wherein the reflective plate has a rectangular shape, a length of the reflective plate ranges from 30 nm to 50 nm, and a width of the reflective plate ranges from 10 nm to 30 nm, such that each of the reflective plates substantially corresponds to one crystalline grain in the amorphous silicon layer.

3. The thin film transistor of claim 1, wherein a distance between adjacent reflective plates ranges from 30 nm to 70 nm.

4. The thin film transistor of claim 1, wherein the thickness of the reflective plate ranges from 50 nm to 80 nm.

5. The thin film transistor of claim 1, wherein the active region is positioned at a side of the reflective plate away from the base substrate.

6. The thin film transistor of claim 1, further comprising a gate insulation layer, a gate, a source and a drain, wherein
   the gate insulation layer, the gate, the source and the drain are provided at a side of the active region away from the reflective plates.

7. The thin film transistor of claim 1, wherein the reflective plate is made of metal material.

8. The thin film transistor of claim 7, further comprising an insulation layer provided between the active region and the reflective plates.

9. The thin film transistor of claim 7, wherein the metal material comprises neodymium and/or aluminum.

10. The thin film transistor of claim 1, wherein the reflective plates are provided at only the positions corresponding to the active region.

11. The thin film transistor of claim 1, wherein the reflective plates are provided throughout the entire base substrate.

12. An array substrate, comprising the thin film transistor of claim 1.

13. A method for fabricating the thin film transistor of claim 1, comprising:
    forming reflective plates and an amorphous silicon layer on a base substrate; and
    irradiating the amorphous silicon layer with laser such that the amorphous silicon layer is crystallized into a polysilicon layer, wherein the laser is emitted from a side of the amorphous silicon layer away from the reflective plates.

14. The method of claim 13, wherein the laser irradiating onto the reflective plates is reflected back by the reflective plates and irradiates on the amorphous silicon layer again, so that a temperature of parts of the amorphous silicon layer at positions corresponding to the reflective plates is further increased to form a temperature gradient.

15. The method of claim 13, wherein the reflective plate is made of metal material.

16. The method of claim 13, wherein forming the reflective plates and the amorphous silicon layer on the base substrate comprises:
    forming a plurality of reflective plates spaced apart from each other on the base substrate;
    forming a filling layer in gaps between the plurality of reflective plates;
    forming an insulation layer on the plurality of reflective plates and the filling layer; and
    forming the amorphous silicon layer on the insulation layer.

17. The method of claim 13, further comprising:
    performing a patterning process on the polysilicon layer to form a pattern of an active region.

18. The method of claim 13, further comprising:
    performing, after forming the amorphous silicon layer, a patterning process on the amorphous silicon layer to form a pattern corresponding to an active region.

19. The method of claim 13, further comprising:
    forming patterns comprising a gate insulation layer, a gate, a source and a drain after laser irradiation.

\* \* \* \* \*